United States Patent [19]

March

[11] Patent Number: 4,779,211
[45] Date of Patent: Oct. 18, 1988

[54] POSITION SENSOR

[75] Inventor: Adrian A. C. March, Bordon, England

[73] Assignee: Adrian March Limited, England

[21] Appl. No.: 774,488

[22] Filed: Sep. 10, 1985

[30] Foreign Application Priority Data

Sep. 12, 1984 [GB] United Kingdom ............... 8423086

[51] Int. Cl.$^4$ .......................... G01B 3/02; G01D 5/34
[52] U.S. Cl. ............................ 364/559; 250/231 SE;
33/140; 364/560; 364/807; 341/51
[58] Field of Search ................................ 364/560–562,
364/550, 551, 552, 807–810, 825, 559; 33/125
A, 125 C, 137 R, 138, 140; 340/347 P; 250/231
SE; 358/107

[56] References Cited

U.S. PATENT DOCUMENTS

| | | | |
|---|---|---|---|
| 3,982,106 | 9/1976 | Stutz | 377/3 |
| 4,117,602 | 10/1978 | Lapeyre | 364/559 X |
| 4,139,889 | 2/1979 | Ingels | 340/347 P X |
| 4,330,769 | 5/1982 | Dean et al. | 333/165 |
| 4,342,025 | 7/1982 | Spälti et al. | 250/231 SE X |
| 4,360,730 | 11/1982 | Breslow | 340/347 P X |
| 4,414,754 | 11/1983 | Lapeyre | 33/125 C X |
| 4,417,317 | 11/1983 | White et al. | 364/825 |
| 4,439,672 | 3/1984 | Salaman | 250/231 SE X |
| 4,445,110 | 4/1984 | Breslow | 250/231 SE X |
| 4,465,928 | 8/1984 | Breslow | 250/231 SE |
| 4,572,952 | 2/1986 | March | 356/375 X |
| 4,595,991 | 6/1986 | Spies | 364/559 X |
| 4,606,008 | 8/1986 | Wason | 364/560 |
| 4,616,833 | 10/1986 | Geller | 250/221 X |
| 4,618,941 | 10/1986 | Linder et al. | 364/825 X |
| 4,621,256 | 11/1986 | Rush | 250/231 SE X |
| 4,633,224 | 12/1986 | Gipp et al. | 250/231 SE X |

FOREIGN PATENT DOCUMENTS

| | | |
|---|---|---|
| 0039921 | 11/1981 | European Pat. Off. |
| 0100243 | 2/1984 | European Pat. Off. |
| 1284641 | 8/1972 | United Kingdom |
| 1511044 | 5/1978 | United Kingdom |
| 2126444 | 3/1984 | United Kingdom |

Primary Examiner—Parshotam S. Lall
Assistant Examiner—Joseph L. Dixon
Attorney, Agent, or Firm—Larson and Taylor

[57] ABSTRACT

A position sensor has a detector having a plurality of sensitive elements which are acted on by indicia of a scale so that each sensitive element detects overlap between itself and one or more indicia of the scale. The outputs of the sensitive elements are modified by weighting values so that there is one position of detector and scale where the sum of the outputs has a unique characteristic. This position can be detected by means analyzing the sum of the outputs, and can then detect displacement of scale and detector from that one position. The indicia used have a non-uniform pattern, but other indicia with a pitch less than twice but not equal to the pitch of the sensitive elements may be provided to permit interpolation to fractions of the pitch of the sensitive elements. Further interpolation may be provided by a register through which signals propagate at a rate which is a multiple of the rate they are received. The register elements modify the signals by weighting values and the sum of the register element outputs is determined.

21 Claims, 6 Drawing Sheets

DIRECTION OF CHARGE MOVEMENT

POSITION SENSOR

BACKGROUND OF THE INVENTION

1. Field of the Invention

The present invention relates to a position sensor. It is applicable both to an angular sensor detecting rotation of one body relative to another, and to a linear sensor detecting linear movement.

2. Summary of the Prior Art

In my European patent application No. EP-A-0100243 (corresponding to U.S. Pat. No. 4,572,952) I disclosed a position sensor in which binary and bar pattern tracks on a scale act on a detector of sensitive elements in a two dimensional array. Each sensitive element detects the overlap between itself and an indicium of the track (for a bar pattern, each bar of the pattern, whether light or dark, forms an indicium). The signals generated by the sensitive elements of the detector are processed by computer correlation to yield precise data regarding the position of the tracks, and hence the scale, relative to the detector. The scale is preferably the optical image of a pattern of markings on one body, with the detector being mounted on another body, so that the relative positions of the two bodies may be determined.

Computer processing of the signals from the sensitive elements requires analogue-to-digital conversion, is inconveniently time consuming, and greatly increases the size of the sensor. The present invention therefore seeks to overcome, or at least ameliorate, these problems.

SUMMARY OF THE INVENTION

It does this, in a first aspect of the present invention, by assigning a weighting value to at least those sensitive elements acted on by a non-uniform (preferably pseudo-random) track so that the signals from the sensitive elements depend on both overlap and a weighting value for that sensitive element. The weighting values are chosen so that there is a position of scale and detector where the sum of the signals has a unique characteristic. This gives a reference position from which other positions may be determined by the change in sum of the signals. It is thus possible to determine the position of scale and detector simply.

It is known to sense non-destructively the signal charges on a charge coupled shift register by means of additional electrodes, which may be connected to a summing amplifier, and are known as "tappings". If each such electrode is divided into two portions, connected respectively to the positive and negative inputs of a differential amplifier, a "weighting value" is defined for that tapping dependent on the ratio in which the electrode is divided, and a selective filter can be formed which is capable of recognizing charge pattern when it reaches a particular location. A charge coupled electro-optic detector is, in effect, a light-sensitive shift register, and therefore it is possible to add tappings to the sensitive elements in order to permit some of the signal processing to be carried out within the detector itself.

Therefore the sensitive elements preferably include charge-sensing electrodes which sense the charge (generated by the overlap of indicia) on that sensitive element.

This is particularly advantageous in the preferred use of a scale which is an optical image. However, it should be borne in mind that the present invention is applicable to other ways of generating the scale and tracks.

If the invention was used with a scale having only a pseudo-random track, the invention would make possible the rapid detection of the positions of the scale and detector to an accuracy equal to the width of a sensitive element, with a simple counter and detector circuit. When greater accuracy is sought the idea underlying EP-A-0100243 (corresponding to U.S. Pat. No. 4,572,952) may be used. This involves one or more tracks having a pitch less than twice, but not equal to the pitch of the sensitive elements (preferably two tracks, one with indicia having a pitch slightly greater than the pitch of the sensitive elements, and one with indicia having a pitch slightly less). This permits the positions of scale and detector to be measured to a fraction of the pitch of the sensitive elements, and the present invention permits this measurement to be performed quickly and simply using tapped charge-coupled shift registers and logic circuits.

The present invention is applicable both to sensors for detecting the absolute positions of scale and detector, and to incremental encoders in which output signals are required to change in accordance with a defined number of increments per revolution or per unit distance moved. This requirement can be satisfied wiht a sensor of the type shown in EP-A-0100243 (corresponding to U.S. Pat. No. 4,572,952) only if the sensor can be interrogated with sufficient frequency in relation to the shortest time taken for one increment, and the processing speed which can be achieved using the present invention enables a practical increment rate to be achieved.

The present invention also has a second aspect, which permits interpolation of position to a fraction of pixel pitch. It uses a register which has a plurality of elements in series and signals from the sensitive elements of the detector are stepped through the register at a rate which is a multiple of the rate at which the signals are received. Each element of the register receiving a signal then modifies it by a weighting value. By analyzing the outputs of the register elements, e.g. by generating their sum, it is possible to determine the position of the scale relative to the detector to a high accuracy.

Furthermore, use of a register in this way is applicable to other processing, as an alternative to position detection. It can be used as an analogue processor for determining relationships between signals fed to it, and in particular is applicable to analogue solution of equations.

BRIEF DESCRIPTION OF THE DRAWINGS

Embodiments of the invention will now be described by way of example with reference to the accompanying drawings, in which.

DESCRIPTION OF THE PREFERRED EMBODIMENTS

Figure 1:
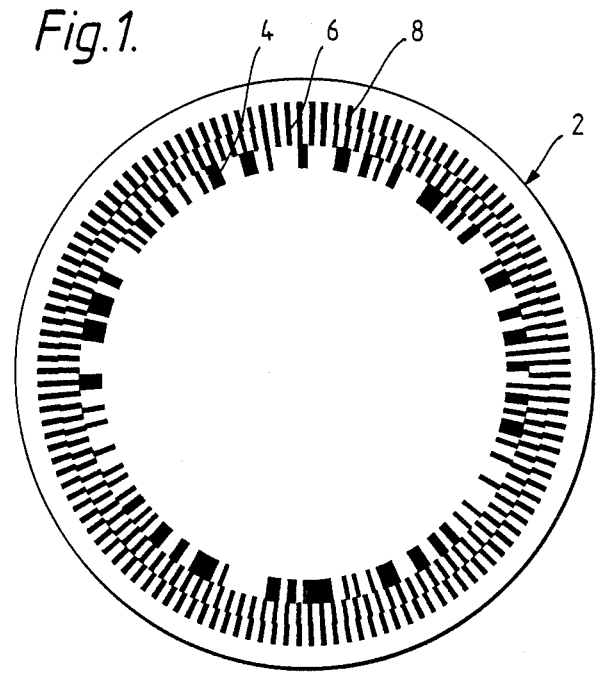
FIG. 1 represents an angular encoder scale of a type suitable for use in the present invention.

A disk, which may conveniently be of glass (although other materials may also be used), is mounted on a shaft so that it rotates about its center, and carries on its surface a pattern of markings. An optical system generates an image 2 shown in FIG. 1 from that pattern which image has tracks 4, 6 and 8. The disk generating the image 2 shown in FIG. 1 is used in conjunction with a sensor 10 illustrated in FIG. 2, consisting of a silicon die (a "chip") carrying three rings 12, 14 and 16 each consisting, in the present example, of 256 sensitive elements (pixels). In operation, an image 2 of the disk is a reduced one, so that the sensor 10, may be dimensionally very much smaller than the disk. It is the purpose of the optical system to ensure that tracks 4, 6 and 8 of scale 2 fall respectively over the pixel rings 12, 14 and 16.

Figure 3:
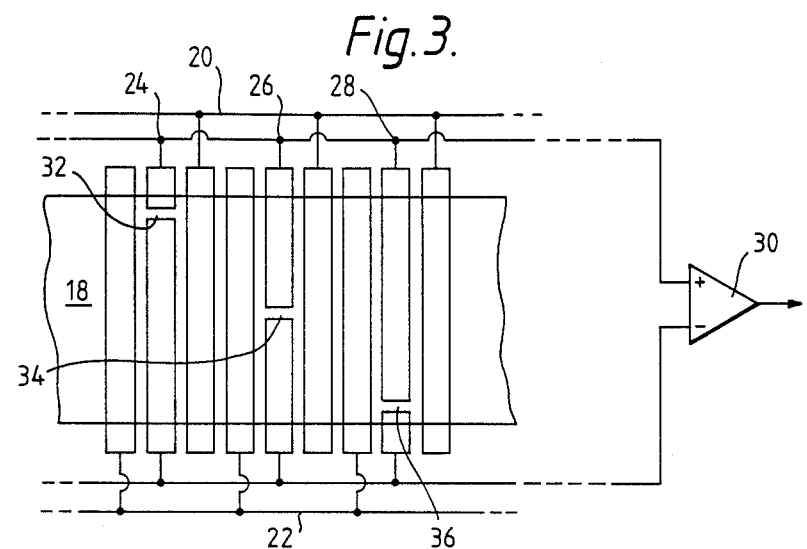
FIG. 3 is a diagrammatic representation of a portion of one of the rings of sensitive elements of a circular array sensor showing charge sensing electrodes connected to a summing amplifier.

Each of the pixels in the sensor 10 incorporates an electrode to sense the charge on that pixel in a manner known in the technology of charge coupled devices. For convenience of description, the operation of such charge-sensing electrodes is illustrated diagrammatically in FIG. 3, showing a charge coupled shift register channel 18, and electrodes 20 and 22 which constitute the conventional two phase charge transport electrodes. The electrodes 24, 26 and 28 represent the charge-sensing electrode on three consecutive pixels, and are split at positions 32, 34 and 36 respectively, with an appropriate proportion of each being connected to the positive and negative inputs of a differential amplifier 30. The "weighting value" of each electrode depends upon the position of the split: thus the electrode 24 has a weight of −1 because virtually the whole active area is connected to the negative amplifier input, the weight of 26 is 0 because the two areas are equal, and the weight of 28 is +1. The use of integral values is given here for simplicity; in fact the majority of the electrodes will have non-integral weighting values.

Figure 2:
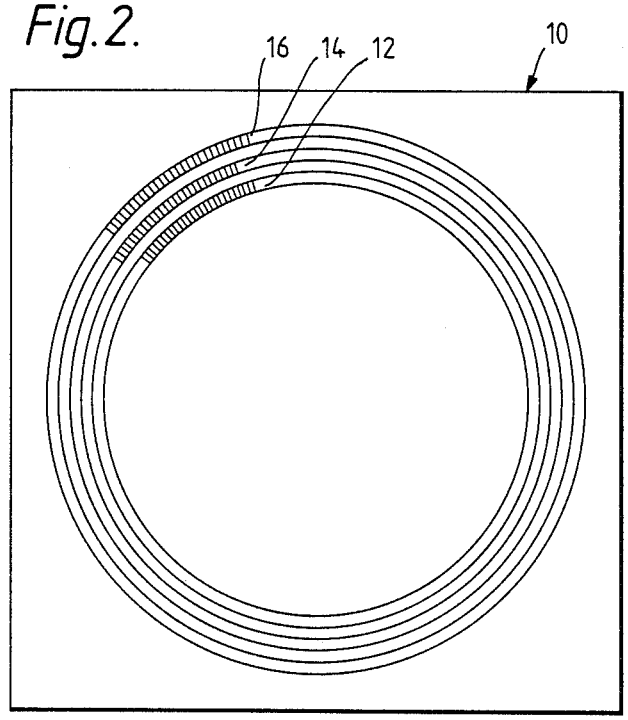
FIG. 2 represents a circular array sensor intended to be used in conjunction with the scale shown in FIG. 1.

In the case of the sensor 10 of FIG. 2, the charge-sensing electrodes ("taps") in each pixel ring are connected to separate differential amplifiers (not shown) so that there are three outputs from the sensor 10 each representing the sum of the signals from the corresponding pixel rings. In operation, the tracks 4, 6 and 8 (FIG. 1) are imaged on the pixel rings 12, 14 and 16 (FIG. 2) with sufficient intensity and duration to generate charges of adequate magnitude on the pixels. As this charge pattern is stepped 256 times round the circle, the outputs from each of the tapped pixel rings represent a correlation between the charge on each pixel in the ring and its tapping weight.

In the practical design of a sensor of this nature, a number of features may be provided which will be evident to those skilled in the art. For example, if the pixels are also to function as the tapped shift register, the sensor should preferably be used with strobed illumination, since continuous illumination would normally totally blur the charge pattern. In addition, after a processing cycle has been completed and before the sensor is again illuminated, the pixels should be cleared of charge; this can be achieved by incorporating a suitable electrode to create a potential well in the silicon immediately adjacent to each pixel. Another practical consideration will be the need for electrical conductors to cross the pixel rings; although such conductors can be made partially transparent, they are bound to degrade the sensitivity of the pixels which they cross. Since the performance of the sensors depends on the integrated effect of all the charges round the circle, a loss in sensitivity of some of the pixels has no serious effect on the performance. As an alternative to the pixels functioning as the tapped shift register, a separate tapped shift register may be provided in receiving signals from the pixels. For example, the tapped shift register may be in the form of a ring surrounding the ring of pixels, with each pixel having a unique corresponding element in the shift register ring.

The weighting values relating to the inner pixel ring 12 are arranged to correspond with the pseudo-random non-repeating binary pattern of the corresponding inner scale 4. In consequence, there will be one position yielding a high correlation between the tap weights and the pixel charges, and in that position a uniquely high output will be obtained from the pixel ring. The weighting values could alternatively be arranged to give a uniquely low value, or indeed any other value or pattern of values which is unique to one position. By counting the number of pixel shifts which take place before this correlation is detected, the angular position of the scale 4 with respect to the pixel ring 12 is determined to the nearest pixel position. Interpolation to fractional parts of a pixel position, as explained in EP-A-100243 (corresponding to U.S. Pat. No. 4,572,952) is obtained by the operation of scales 6 and 8, having respectively 126 and 130 bar pairs (pairs of indicia) which act in conjunction with the 256 pixels in each of rings 14 and 16 to generate charge patterns akin to moiré fringes.

Figure 4:
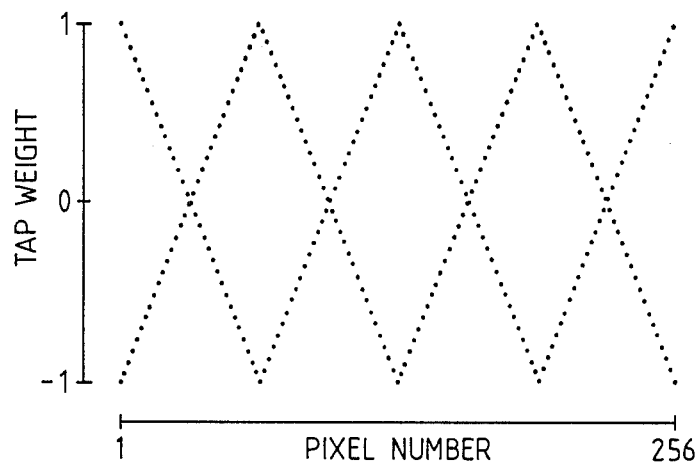
FIG. 4 represents a sequence of weighting values around a ring of sensitive elements of a circular array sensor to be used in conjunction with an image of a radial bar pattern of the type shown in the two outer rings of FIG. 1.
Figure 5:
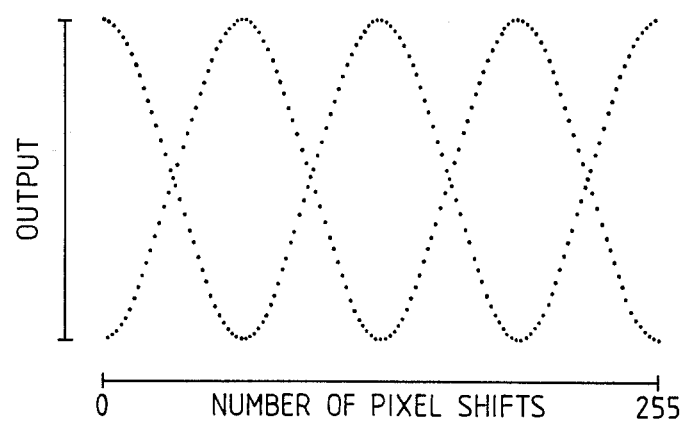
FIG. 5 illustrates a typical output signal from a ring of sensitive elements in accordance with FIG. 4 which results from shifting an ideal moiré charge pattern round the ring.

The weighting values relating to rings 14 and 16 are required to provide the best possible determination of the positions of the moiré charge patterns on those rings; FIG. 4 illustrates an arrangement which has proved satisfactory, in which the pattern of weighting values is equivalent to two cycles of an ideal moiré waveform. The resultant output from each of the rings 14 and 16 as a practical charge pattern is shifted round the circle is shown in FIG. 5; in order to determine the position of the charge pattern on the pixel ring, the phase of the output waveform has to be determined relative to the signals stepping it round the ring. It will be evident from FIG. 5 that the positions of peak correlation—the crests of the signal envelope—are of little help in determining the phase, since at these positions the rate of change of signal with position is at a minimum. The most accurate phase measurement is derived from the intersections, where the rate of change of signal with position is a maximum; since, in the example illustrated, there are two cycles of moiré pattern round the ring, of the four intersections shown two represent increasing output signal on an odd number of shifts and two represent decreasing output on an odd number of shifts: in determining the correct phase of the signal, it is essential that these are distinguished.

As with the pixel ring 12, the weighting values relating to the rings 14, 16 may be generated using pixels which also function as the tapped shift register, or by separate pixel and register rings.

Although the pixel shifts are by their very nature integers, the output signal in each position is an analogue function, and it is possible to determine the position of an intersection, and hence the phase of the signal envelope, to a fraction of a pixel dimension. The accuracy which can be achieved in this interpolation process is limited by a number of practical factors, of which electrical noise and variations in pixel sensitivity are likely to be the most important; in practice, a sub-division to an eighth of a pixel shift could be considered reasonable.

Figure 6:
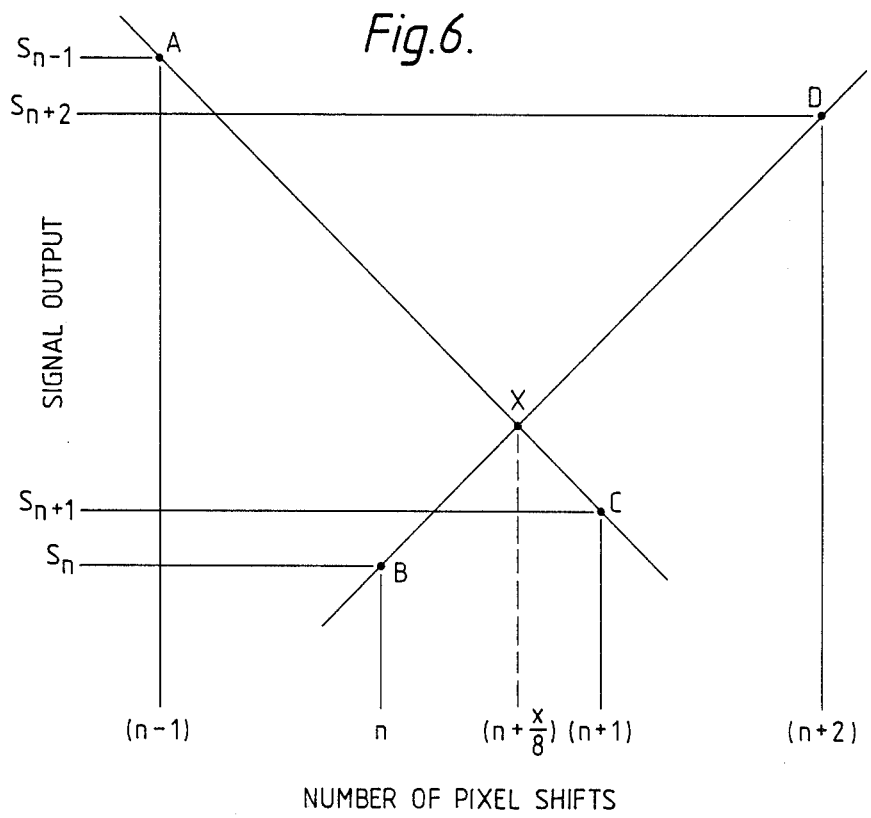
FIG. 6 represents on an enlarged scale a portion of FIG. 5 in the vicinity of an intersection.

FIG. 6 illustrates a representative case of an intersection occuring at a fractional part of a pixel dimension. In this example the output signal values represented by the points A, B, C and D are respectively $S_{n-1}$, $S_n$, $S_{n+1}$ and $S_{n+2}$, as they occur respectively at $(n-1)$, n, $(n+1)$ and $(n+2)$ pixel shifts. The effective position of the intersection may be regarded as the intersection of the straight lines AC and BD; for arithmetic convenience it has been shown in the position represented by $(n+x/8)$ pixel shifts where x is an integer, although in practice the fractional portion can take any value between 0 and 1.

Applying elementary co-ordinate geometry to the construction of FIG. 6, the following equation can be shown to hold:

$$S_{n-1}\cdot(8-x)+S_n\cdot(x-16)+S_{n+1}\cdot(8+x)-S_{n+2}\cdot x=0$$

Figure 7:
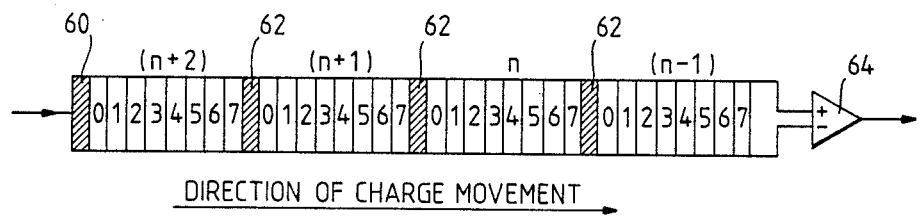
FIG. 7 illustrates the general arrangement of shift register for performing a position sub-division to $\frac{1}{8}$ of the pitch of a sensitive element, using four consecutive output signal values.

In order to locate the intersection to the nearest eighth of a pixel dimension, it is required to establish what integral value of x lying in the range 0 and 7 most nearly satisfies the foregoing equation. One way of achieving this is to move the signals successively through another tapped charge coupled shift register, in which the weighting values represent the different possible values of the coefficients in the equation. The fractional position of the intersection is found when on a transfer of the four signal values from one set of weightings to another, the output of the tapped shift register changes sign. The principle of design of a tapped shift register to perform this function is illustrated in FIG. 7. The underlying idea, which as mentioned above is another aspect of the present invention, is that the tapped shift register transmits signals (which may be e.g. the signals derived from the charge sensing electrodes of the arrangement shown in FIG. 3) sequentially through its elements at a rate which is a multiple of the rate at which the signals are received. The multiple is preferably $2^n+1$ where n is integral. The signals in the register are then modified by weighting values and the result analyzed.

In the arrangement illustrated in FIG. 7, n is set at 3 so signals enter the register at element 60 and are propagated at nine times the rate at which the charge is stepped round the pixel ring on the sensor, so that at all times the signals in the tapped shift register performing the interpolation are spaced nine elements apart.

Thus if it is assumed that the four signal values shown in FIG. 6, $S_{n-1}$ will enter the interpolation register first, followed successively by $S_n$, $S_{n+1}$ and $S_{n+2}$, and at the instant that $S_{n+2}$ has just entered the interpolation register at element 60 the other three signals will be on the three shaded elements 62. The legends $(n+2)$, $(n+1)$, n and $(n-1)$ illustrate how the coefficients in the equation for the intersection are represented by the weighting values in different regions of the register; in each region, the numbers identifying the individual elements represent values of x to which the weighting values correspond. Since the value of x corresponding to the intersection is taken to be represented by the set of elements at which a reversal of sign of the output from the register occurs when the signals have moved into them, in other words, when the value of x is incremented by 1, there has to be a starting position preceding the acceptable values of x. The starting positions for the four signal values are represented by the shaded elements 60 and 62 in the illustration; they correspond to a value of x of $-1$, and any change of sign in the register output when signals move into these positions is disregarded. It will be evident that this occurs when each new signal value enters the register. A set of values of weighting values for an interpolation processor register to perform the functions described is listed in the table below:

| | WEIGHTING VALUES × 17 For Tapped CCD Interpolation Processor | | | |
|---|---|---|---|---|
| Coefficient of x | $S_{n-1}$ $(8-x)$ | $S_n$ $(x-16)$ | $S_{n+1}$ $(8+x)$ | $S_{n+2}$ x |
| $-1$ | 9 | $-17$ | 7 | $-1$ |
| 0 | 8 | $-16$ | 8 | 0 |
| 1 | 7 | $-15$ | 9 | 1 |
| 2 | 6 | $-14$ | 10 | 2 |
| 3 | 5 | $-13$ | 11 | 3 |
| 4 | 4 | $-12$ | 12 | 4 |
| 5 | 3 | $-11$ | 13 | 5 |
| 6 | 2 | $-10$ | 14 | 6 |
| 7 | 1 | $-9$ | 15 | 7 |

As can be seen, the tapped shift register of FIG. 7 is acting as an analogue processor for solving equations; and could be used in situations other than those where the imput signals are position related.

There is no reason why a greater number of signal values than 4 should not be processed to determine the position of the intersection, and under practical conditions this may well yield greater accuracy. A longer processor register will be required, in which the weighting values correspond to the coefficients of two simultaneous equations if eight signal values are to be processed, three simultaneous equations if twelve signal values are to be processed, and so on. In practice there is unlikely to be any practical benefit in going beyond sixteen signal values, and twelve values may be found to give as good a result. A further complication in processing a large number of signal values is that they do not fall precisely on two straight lines, and corresponding corrections to the weighting values have to be made.

Figure 8:
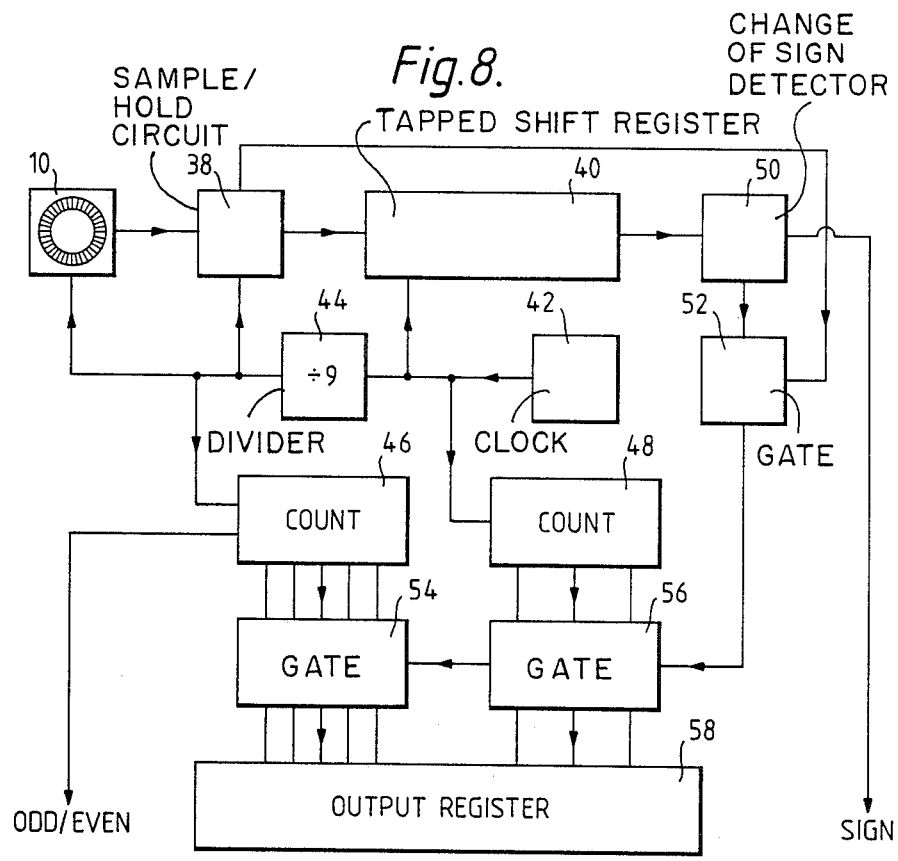
FIG. 8 illustrates in diagrammatic form the general arrangement of a sensor used in conjunction with a tapped shift register to perform a position sub-division.

The block diagram of FIG. 8 illustrates the operation of a tapped shift register interpolation processor in conjunction with one of the pixel rings 14 or 16 of the sensor 10 shown in FIG. 2. The output from the sensor 10 is transferred through a sample and hold circuit 38 to the input of the tapped shift register 40. The clock drive circuit 42 controls charge transfer within the shift register 40, and the divider circuit 44 generates waveforms at one ninth of the main clock frequency to control charge transfer round the sensor 10 and to operate sample and hold circuit 38. Counters 46 and 48 register the number of transfers which have taken place in the sensor 10 and shift register 40 respectively. The change of sign detector 50 produces an output when the output of the shift register 40 changes sign, and opens the gates 54 and 56 to transfer the counts in registers 46 and 48 to the output register 58. Whenever a new signal enters the shift register 40, an output from the sample and hold circuit 38 inhibits a spurious change of sign output by means of the gate 52. Each time that a change of sign signal causes a new count to be transferred to the output register 58, a signal from the least significant bit of counter 46 indicates whether an odd or even number of pixel shifts has taken place, and another signal from the change of sign detector 50 carries the sign of the output of the shift register 40; together, these establish which of the two types of intersection in the waveform illustrated in FIG. 5 has been detected; this information is used, in a conventional manner, to combine the four intersection positions in the range 0–256 pixels into a single measurement of the phase of the charge pattern in the range 0–128 pixels.

It will be evident that if the processing scheme illustrated in FIG. 8 is applied to the pixel ring 14 of the sensor 10 (FIG. 2) the majority of it will require to be duplicated for the other pixel ring 16, only the driver clock 42 and the divider 44 being common to both. In the operation of an encoder according to the principles expressed in EP-A-100243 (corresponding to U.S. Pat. No. 4,572,952), the phase difference between the patterns on pixel rings 14 and 16 is required: this is obtained straightforwardly by subtracting the phases of the patterns on each of the two rings. In the example taken, with rings of 256 pixels having two cycles of moiré pattern on each, the phase difference can conveniently be expressed in the range ±64 pixels. In the event that the division in the image of scale 4 (FIG. 1) fall in the center of pixels in ring 12 (FIG. 2), there will be two pixel shifts yielding approximately the same output from pixel ring 12, and the sign of the phase difference between the patterns on pixel rings 14 and 16 serves to determine which of the two possible pixel shift counts from ring 12 should be used.

Figure 9:
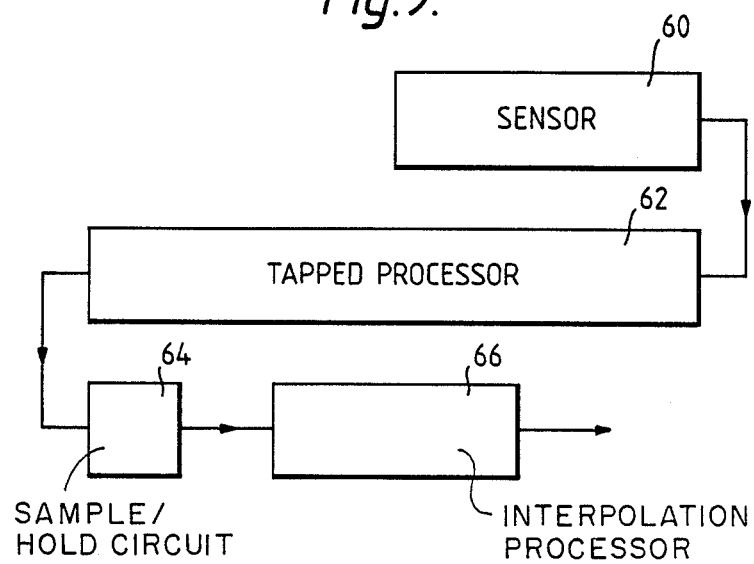
FIG. 9 represents an arrangement using a tapped shift register to process the signals from an optical sensor which is not tapped.

Although the foregoing description has been concerned with an arrangement in which the sensitive elements (pixels) embody the charge sensing tappings required for processing the signal, it is also possible for these functions to be separated. In this case, however, it is necessary for the tapped shift register in which the processing is carried out to have twice as many elements as the sensor whose signal it is processing, in order that the sensor output can be transferred to the processor and then shifted during processing through a number of shifts equal to the number of pixels in the sensor. FIG. 9 represents a simplified block diagram of a sensor and separate processor equivalent to one pixel ring of the sensor in FIG. 2. In this example, the sensor 60 represents a 256 pixel linear array, or a circular array having an electrical break in the circle such that the signals on the individual pixels emerge sequentially. The tapped processor 62 contains 512 elements, having weighting values varying as two repetitions of FIG. 4, namely, four complete cycles of weighting value variation. After the 256 pixels signals from the sensor 60 have been transferred to the processor 62, the effect of 256 shifts along the processor is exactly equivalent to shifting the charge pattern on one of the pixel rings of the sensor 10 in FIG. 2 once round the complete circle; with two cycles of a moiré pattern on the sensor 60, the output from the processor 62 will be similar to that illustrated in FIG. 5. It will be evident that the output signal form the processor 62 can be transferred through a sample and hold circuit 64 to an interpolation processor 66, corresponding to the sammple and hold circuit 38 and the processor 40 of FIG. 8.

Figure 10:
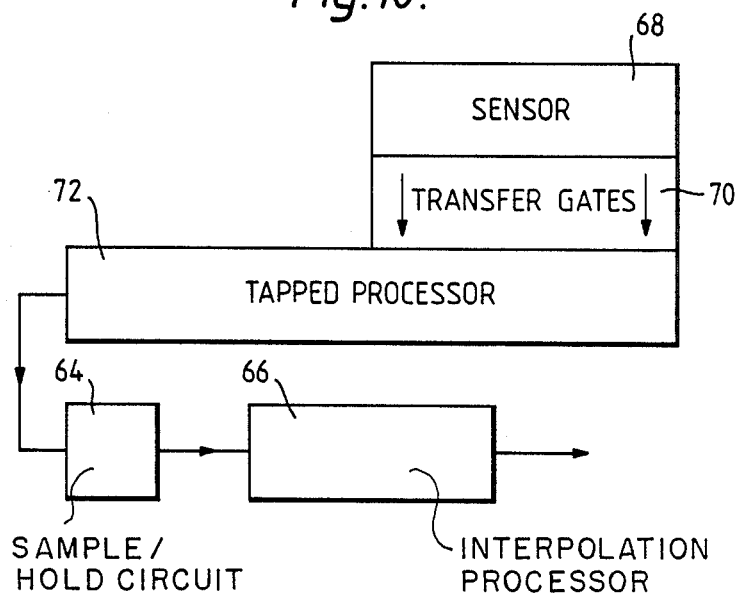
FIG. 10 illustrates an alternative scheme in which an optical sensor is coupled to a tapped shift register.

An alternative method of transferring signals from a sensor to a processor register is illustrated in FIG. 10, in which signals from the sensor 68 are shifted laterally through a set of transfer gates 709 into the first portion of the tapped processor 72, instead of being transferred serially as in the arrangement of FIG. 9. An important advantage of the parallel transfer arrangement of FIG. 10 is that the timing of transfer charge from the sensor 68 may in certain cases be used to control the exposure time of the sensor, which may enable continuous, rather than strobed, illumination to be used. Parallel transfer of sensor signals into the processor would not affect subsequent processing techniques, and the processor 72 could be followed by a sample and hold circuit 64 and an interpolation processor 66 in exactly the same way as the processor 62 of FIG. 9 and the sensor 10 of FIG. 8.

Figure 11:
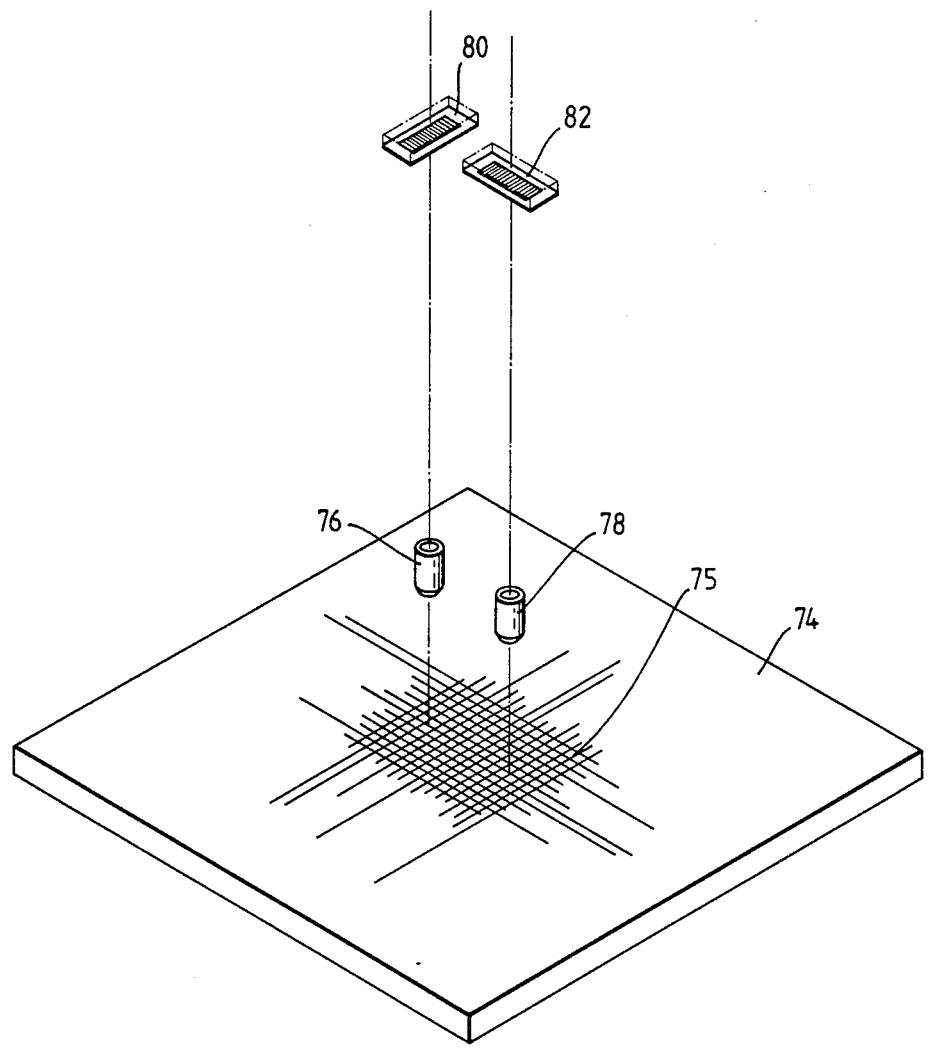
FIG. 11 depicts a two-dimensional measuring system embodying the principles of the invention.

On application for the sensor and processor arrangement of FIGS. 9 and 10 is in the X-Y measuring system illustrated diagrammatically in FIG. 11. The master scale 74 carries an orthogonal grid pattern 75 of equi-spaced straight lines, which it is possible conveniently to produce by photographing diffraction patterns generated by an interferometer; although FIG. 11 shows the grid pattern extending only over a small area, it will be apparent that its extent requires to be sufficient for the required measuring range. The grid pattern 75 of the scale 74 is imaged by lenses 76 and 78 respectively on two linear sensors 80 and 82 having their charge transfer directions ("axes") respectively parallel to the two line directions on the scale 74. Typically, the lenses 76 and 78 and the sensors 80 and 82 are in a rigid mechanical mounting (not shown) which is free to move in two dimensions in a plane parallel to that of the scale 74; alternatively, the lenses and sensors can remain stationary, and the scale 74 move relatively to them. The lenses 76 and 78 are so arranged that the images of the grid pattern 75 generate a moiré pattern on the sensors 80 and 82: for example, with 126 line pairs on the grid corresponding to 256 pixels in the sensors 80 and 82. The sensors will desirably have the pixel dimension in a direction perpendicular to the axis substantially larger than the width of the pixel along the axis, so that the sensor is sensitive to movement of the scale image along its axis and insensitive to movement of the image perpendicular to the axis. Alternatively, the sensors may be mounted with their axes slightly out of parallel with the line direction on the scale 74.

It will be evident that the arrangement of FIG. 11 constitutes a two-dimensional measuring system, capable of performing precise interpolation between the grid lines 75 on scale 74, while at the same time averaging individual line errors by using a relatively large number of lines in each measurement. In operation, the integral part of the line count can be derived from the processed outputs of the sensors 80 and 82, or it can be obtained by separate conventional counting means (not shown).

Other possible modifications of the system will be apparent from the description: for example, the sensors could be positioned in the image plane of a single lens, although this might complicate the optical design since either one or both of the sensors would be operating off the axis of the lens. Alternatively, both sensors could be formed on the same silicon chip, which would render the off-axis dimension negligible, or they could be arranged to intersect, although the design problems would be formidable.

To illustrate the performance of a system of the type illustrated in FIG. 11, by way of example, if the sensors have 256 pixels, there are two cycles of moiré pattern on each, and an interpolation processor is used capable of determining the phase of the moiré pattern to $\frac{1}{8}$ of a pixel shift, then each line pair on the grid 75 can be sub-divided into 1024 divisions. To maintain optimum performance of an interpolation system of this type, it is necessary for the number of line pairs in the scale image which correspond to 256 pixels on the sensor to be accurately controlled. One way to achieve this would be to vary the lens position automatically to maintain the signal output from the processor at its maximum level, indicating that the wavelength of the moiré pattern corresponded with that defined by the processor tappings. An alternative method of controlling the line spacing in the image relative to the pixel spacing on the sensor is to rotate the sensor slightly about the optic axis.

It will be evident that numerous other embodiments of the invention are possible, using the various techniques described, both singly and in combination. Furthermore, the techniques described with reference to the present invention are in generally equally appropriate to the embodiments described in EP-A-100243 (U.S. patent application Ser. No. 517262 now U.S. Pat. No. 4,572,952, issued on Feb. 25, 1986).

What is claimed is:

1. A position sensor comprising:
   a detector having a plurality of sensitive elements;
   a scale having at least one track of indicia with a non-repeating pattern, said at least one track having a predetermined shape, said scale being movable relative to said detector, said indicia of said at least one track acting on sensitive elements of at least a part of said detector, said at least a part of said detector having sensitive elements forming a track with a shape corresponding to said predetermined shape of said at least one track, and each of said sensitive elements being operative to detect overlap of that sensitive element and at least one corresponding indicium of said indicia; and
   means for simultaneously analyzing signals derived from each of said sensitive elements of said at least a part of said detector to determine the relative positions of said detector and said scale, and analyzing means including means for generating the sum of said signals derived from said sensitive elements, said signals derived from said sensitive elements to said analyzing means depending on said overlap for the corresponding sensitive element and a correlation weighting value associated with that sensitive element, said correlation weighting values being such that there is a relative position of said scale and said detector for which said sum has a unique characteristic, said analyzing means also including means for determining from said sum the displacement of said scale relative to said detector from said relative position for which said sum has a unique characteristic.

2. A position sensor according to claim 1, wherein each sensitive element is associated with a charge sensitive electrode, each of said charge sensitive electrodes generating a displacement current related to said overlap of that sensitive element with said at least one corresponding indicium.

3. A position sensor according to claim 2, wherein each of said charge sensitive electrodes is divided into two parts, the position of the division of each of said charge sensitive electrodes determining said correlation weighting value for that sensitive element.

4. A position sensor according to claim 1, wherein each of said sensitive elements has means for determining said correlation weighting value for that sensitive element.

5. A position sensor according to claim 1, wherein each of said sensitive elements generates an output related to said overlap of that sensitive element with said at least one indicium; and wherein the position sensor further includes means for modifying said outputs of said sensitive elements by the corresponding correlation weighting value for each of said sensitive elements, and generating said signals to said analyzing means.

6. A position sensor according to claim 5, wherein said signals are transmitted in parallel from said sensitive elements to said modifying and generating means.

7. A position sensor according to claim 1, having a first body and a second body, said first body having a pattern of markings thereon, said scale being an optical image of said pattern of markings, said detector being fixed relative to said second body, thereby to determine the relative positions of said first and said second body from the relative positions of said scale and said detector.

8. A position sensor according to claim 1, wherein at least some of said sensitive elements have a first predetermined pitch therebetween, and said scale has a second track of indicia, adjacent indicia in said second track having a second pitch therebetween, said second pitch being less than twice but not equal to said first pitch.

9. A position sensor according to claim 1, wherein said analyzing means includes means for receiving signals from said sensitive elements sequentially at a first predetermined rate, a register having a plurality of elements in series, means for supplying said output signals to said register at a second predetermined rate which is a multiple of said first predetermined rate and said register transmitting said signals sequentially through said series of said elements at said second predetermined rate, means for assigning interpolation weighing values to each of said elements of said register, whereby any of said elements receiving one of said signals modifies that output signal by a corresponding one of said interpolation weighting values and generates a corresponding output, and means for analyzing said said outputs of said elements.

10. A position sensor according to claim 9 wherein said second predetermined rate is $2^n + 1$ times said first predetermined rate, where n is an integer.

11. A position sensor according to claim 9, further including means for generating the sum of said outputs of said elements of said register, and means for detecting when said sum changes sign.

12. A position sensor according to claim 1, wherein said sensitive elements form an array of said sensitive elements, said array extending in two dimensions.

13. A method of detecting changes in the relative position of two bodies using a position sensor comprising:
a detector in fixed relationship with one of said two bodies, said detector having a plurality of sensitive elements;
a scale in fixed relationship with the other of said two bodies, said scale having at least one track of indicia, said at least one track having a predetermined shape, said indicia of said at least one track acting on sensitive elements of at least part of said detector, said at least part of said detector having sensitive elements forming a track with a shape corresponding to said predetermined shape of said at least one track, and each of said sensitive elements being operative to detect overlap of that sensitive element and at least one corresponding indicium of said indicia; and
means for analyzing signals derived from said sensitive elements; said method comprising the steps of:
(a) generating a plurality of signals of which each is related to the overlap of a corresponding sensitive element of said at least a part of said detector with said at least one corresponding indicium; (b) providing a plurality of correlation weighting values;
(c) investigating a plurality of relationships between said plurality of signals and said plurality of correlation weighting values, the investigation for each said relationship involving:
(i) modifying each of said signals by a corresponding one of said correlation weighting values to generate a plurality of modified signals, and
(ii) generating the sum of said plurality of modified signals in said analyzing means thereby to obtain a plurality of sums corresponding to said plurality of relationships; (d) analyzing in said analyzing means said plurality of sums to determine the relative position of said scale and said detector, and to thereby determine said relative position of said two bodies.

14. A method according to claim 13, wherein said plurality of correlation weighting values are determined by a charge sensitive electrode associated with each of said plurality of sensitive elements, and each said charge sensitive electrode is divided into two parts, the position of the division of each said charge sensitive electrode determining that one of said plurality of correlation weighting values which is associated with the sensitive element corresponding to that charge sensitive electrode.

15. A method according to claim 13, wherein each of said plurality of sensitive elements generates said plurality of signals related to said overlap of that sensitive element with said at least one indicium, and the position sensor further including means for generating said plurality of correlation weighting values.

16. A position sensor comprising:
a detector having a plurality of sensitive elements;
a scale having at least one track of indicia having a predetermined pattern, said scale being movable relative to said detector, said indicia of said at least one track of indicia acting on sensitive elements of at least a part of said detector, each of said sensitive elements being operative to detect overlap of that sensitive element and at least one indicium of said indicia and to generate output signals related to said overlap, said output signals from said sensitive elements having a relationship therebetween, and said relationship being determined by the relative position of said detector and said scale and said predetermined pattern; and
at least one analog processor having an input for receiving said output signals from said sensitive elements at a first predetermined rate, a register having a plurality of elements in series, means for supplying said output signals to said register at a second predetermined rate, said second predetermined rate being a multiple of said first predetermined rate, and said register transmitting said signal sequentially through said series of elements at said second predetermined rate, means for assigning interpolation weighting values to each of said elements of said register, whereby any of said elements receiving one of said output signals modifies that output signal by a corresponding one of said interpolation weighting values and generates a corresponding output, and means for analyzing said outputs of said elements, thereby to determine said relationship and hence determine the relative position of said detector and said scale.

17. A position sensor according to claim 16, wherein the corresponding output signal from each of said sensitive elements is dependent on said overlap and a correlation weighting value, said correlation weighting value being determined by the corresponding one of said sensitive elements.

18. A position sensor according to claim 17, wherein each of said sensitive elements is associated with a charge sensitive electrode, each of said charge sensitive electrodes generating a displacement current related to said overlap of that sensitive element with said at least one corresponding indicium, each of said charge sensitive electrodes being divided into two parts, the position of the division of each of said charge sensitive electrodes determining the corresponding one of said correlation weighting values for that sensitive element.

19. A position sensor according to claim 16, wherein each of said sensitive elements generates an output related to said overlap of that sensitive element with said at least one indicium, and wherein the position sensor further includes means for modifying said output signals of said sensitive elements by corresponding correlation weighting values for each of said sensitive elements prior to transmission of said output signals to said at least one analog processor.

20. An analogue processor according to claim 16, wherein said second predetermined rate is $2^n+1$ times said first predetermined rate, where n is an integer.

21. An analogue processor according to claim 16, wherein said means for analyzing said outputs of said elements includes means for generating the sum of said outputs of said elements, and means for detecting when said sum changes sign.

* * * * *